(12) United States Patent
Jost et al.

(10) Patent No.: US 10,755,005 B1
(45) Date of Patent: Aug. 25, 2020

(54) PROVIDING A SINGLE COMMAND TO CREATE MULTIPLE CAD FEATURES

(71) Applicant: Dassault Systemes SolidWorks Corporation, Waltham, MA (US)

(72) Inventors: Robert Jost, Malden, MA (US); Byungwook Kwon, Acton, MA (US); Benjamin Henry Schriesheim, Somerville, MA (US)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 413 days.

(21) Appl. No.: 15/389,007

(22) Filed: Dec. 22, 2016

Related U.S. Application Data

(60) Provisional application No. 62/273,842, filed on Dec. 31, 2015.

(51) Int. Cl.
*G06F 30/20* (2020.01)

(52) U.S. Cl.
CPC .................................. *G06F 30/20* (2020.01)

(58) Field of Classification Search
CPC .................................................. G06F 17/5009
USPC .............................................................. 703/6
See application file for complete search history.

(56) References Cited

U.S. PATENT DOCUMENTS 10,108,627 B1 * 10/2018 Sowa ...................... G06F 16/13

OTHER PUBLICATIONS

Abaqus_6.14_2014 (Abaqus Analysis User's Guide Apr. 2014 Downloaded from https://www.sharcnet.ca/Software/Abaqus/6.14.2/v6.14/books/popups/usb-lgl.html).*

Hsu_2010 (Constructive Solid Geometry and Sweep Generation ME550 Geometric Modeling and Computer Graphics Gerontechnology Research Center Yuan Ze University Dec. 10, 2010).*
Abdel_Malek_1999 (Multiple Sweeping Using the Denavit-Hartenberg Representation Method, Computer-Aided Design—Jan. 1999).*
Abaqus_6.14_2014 (Abaqus Analysis User's Guide Apr. 2014 Downloaded from https://www.sharcnet.ca/Software/Abaqus/6.14.2/v6.14/books/popups/usb-lgl.html) (Year: 2014).*
Hsu_2010 (Constructive Solid Geometry and Sweep Generation ME550 Geometric Modeling and Computer Graphics Gerontechnology Research Center Yuan Ze University Dec. 10, 2010) (Year: 2010).*
Abdel_Malek_1999 (Multiple Sweeping Using the Denavit-Hartenberg Representation Method, Computer-Aided Design—Jan. 1999). (Year: 1999).*
Hian_2014 (A persistent naming method of 3D surface modeling for parametric CAD model exchanges, International Journal of Manufacturing Technology Engineers, 2014). (Year: 2014).*

* cited by examiner

*Primary Examiner* — Brian S Cook
(74) *Attorney, Agent, or Firm* — Hamilton, Brook, Smith & Reynolds, P.C.

(57) ABSTRACT

A computer-implemented method and system uses a single command to modify a feature type of a feature in a computer-aided design model. The method and system construct a three-dimensional (3D) model comprised of at least one feature, where the feature type is an extrude, a revolve, and a sweep. A command is provided that upon execution creates an extrude feature, a revolve feature, or a sweep feature. The feature is modified such that the feature changes from one feature type to another feature type. And after modifying the feature, references to a set of faces of the feature are maintained such that other features dependent on the feature properly update.

20 Claims, 8 Drawing Sheets
(3 of 8 Drawing Sheet(s) Filed in Color)

Extruded circle

Fillet on top edge
Revolved cut

PROVIDING A SINGLE COMMAND TO CREATE MULTIPLE CAD FEATURES

RELATED APPLICATION(S)

This application claims the benefit of U.S. Provisional Application No. 62/273,842, filed on Dec. 31, 2015. The entire teachings of the above application(s) are incorporated herein by reference.

BACKGROUND OF THE INVENTION

Computer-aided design (CAD) software allows a user to construct and manipulate complex three-dimensional (3D) models. A number of different modeling techniques can be used to create a 3D model. One such technique is a solid modeling technique, which provides for topological 3D models where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to topological faces bounded by edges. Hereinafter, the terms vertex, edge, and face will be used interchangeably with their respective, corresponding geometric entities.

A design engineer is a typical user of a 3D CAD system. The design engineer designs physical and aesthetic aspects of 3D models, and is skilled in 3D modeling techniques. The design engineer creates parts and may assemble the parts into a subassembly or an assembly. A subassembly may also consist of other subassemblies. An assembly is designed using parts and subassemblies. Parts and subassemblies are hereinafter collectively referred to as components.

In general, a CAD model consists of various features. Examples of features are an extrusion, a revolve, and a sweep. An extrusion feature results from an extrusion operation, which extrudes one or more entities of a 3D model or a two-dimensional (2D) sketch. (After extruding a 2D sketch, a 3D model is created.) A revolve feature results from a revolve operation, which revolves one or more entities about a centerline. A sweep feature results from a sweep operation, which moves one or more entities along a path.

A common approach to building CAD models is history-based modeling, in which the modeling process may begin by creating a base feature controlled by a two-dimensional sketch, which then may be extruded using, by way of non-limiting example, an extrude, a revolve, or a sweep operation. Each subsequent feature of a model of a part is built on a previous feature, and therefore is dependent on a previously created feature. When the user edits a feature of the history-based model, the model is rolled back to a previous state (e.g., the state prior to the creation of subsequent dependent features). The user can then modify the feature and may need to re-create all subsequent dependent features.

Extrude, revolve, and sweep are typically separate features in a CAD system. Yet, these features may be defined by the same set of parameters, profile, and/or path. Therefore, as separate features, the user interface and workflow have redundancies. Additionally, a problem arises when a user wants to change his or her design and use a different feature to create geometry. The user may need to delete the feature and as a result downstream features may fail. The user then creates the new feature, and then must repair the downstream features. The present invention addresses these drawbacks.

SUMMARY OF THE INVENTION

In general, in one aspect, embodiments of the invention feature a computer-implemented method for using a single (common) command to create and modify multiple features in a computer-aided design model. The multiple features are an extrude feature, a revolve feature, and a sweep feature. The feature is modified such that the feature changes from one feature type to another feature type. After modifying the feature, references to a set of faces of the feature are maintained such that other features dependent on the feature properly update.

Another embodiment includes assigning to each face in the set of faces a face identifier and maintaining the references is enabled by retaining the same face identifier for a respective face before and after the modification despite a change in geometry of the face. Yet another embodiment provides a user interface that enables a user to specify that the feature is the extrude feature, the revolve feature, or the sweep feature, and the feature type can be modified by specifying in the user interface another one of the extrude feature, the revolve feature, and the sweep feature.

Other embodiments include a computer-aided design (CAD) system having a processor operatively coupled to a data storage system and a data storage memory operatively coupled to the processor. In such embodiments, the data storage system stores a three-dimensional model, and the data storage memory comprises instructions to configure the processor to construct a three-dimensional (3D) model comprised of at least one feature, where the feature is one of a set of features comprised of an extrude feature, a revolve feature, and a sweep feature, provide a command that upon execution creates one of the extrude feature, the revolve feature, and the sweep feature, modify the feature, where modifying changes the feature from one member in the set of features to another member in the set of features, and maintain references to a set of faces of the feature after modifying the features such that other features dependent on the feature properly update.

Yet other embodiments include a non-transitory computer-readable data storage medium comprising instructions that cause a computer to construct a three-dimensional (3D) model comprised of at least one feature, where the feature is one of a set of features comprised of an extrude feature, a revolve feature, and a sweep feature, provide a command that upon execution creates one of the extrude feature, the revolve feature, and the sweep feature, modify the feature, where modifying changes the feature from one member in the set of features to another member in the set of features, and maintain references to a set of faces of the feature after modifying the features such that other features dependent on the feature properly update.

The details of one or more embodiments of the invention are set forth in the accompanying drawings and the description that follows. Other features, objects, and advantages of the invention will be apparent from the description and drawings, and from the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments of the invention, as illustrated in the accompanying drawings in which like reference characters refer to the same objects throughout the different views. The drawings are not necessarily to scale, emphasis instead being placed upon illustrating embodiments of the present invention.

DETAILED DESCRIPTION OF THE INVENTION

The present invention produces an extrude, a revolve, and a sweep feature to add and remove material from a computer-generated model using the same (a single or common) command, henceforth to be referred to as the super feature command. From a user interface standpoint, the user can clearly see the differences between the methods that produce an extrude, a revolve, and a sweep feature and better understand how the methods operate. From a parametric modeling standpoint, design changes are more flexible and less problematic. For example, using a history-based modeler in which a subsequent feature of a model of a part is built on and dependent on a previous feature of that part, a user may select a feature on which subsequent features are dependent, and change an extrude feature to a sweep feature without having to delete and repair subsequent features.

Figure 1A:
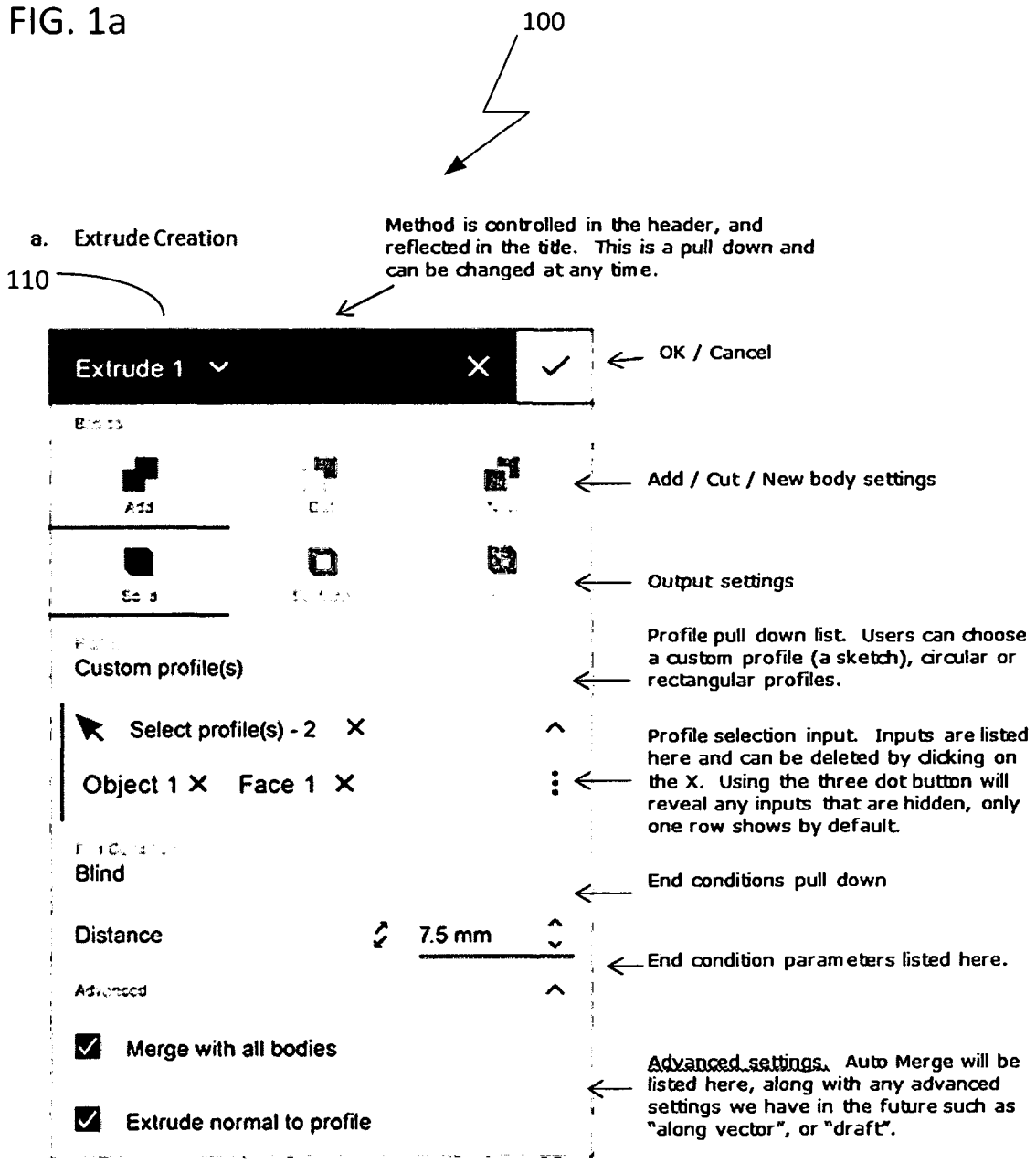
FIG. 1a-1c are illustrations of a user interface in an embodiment of the present invention.
Figure 1B:
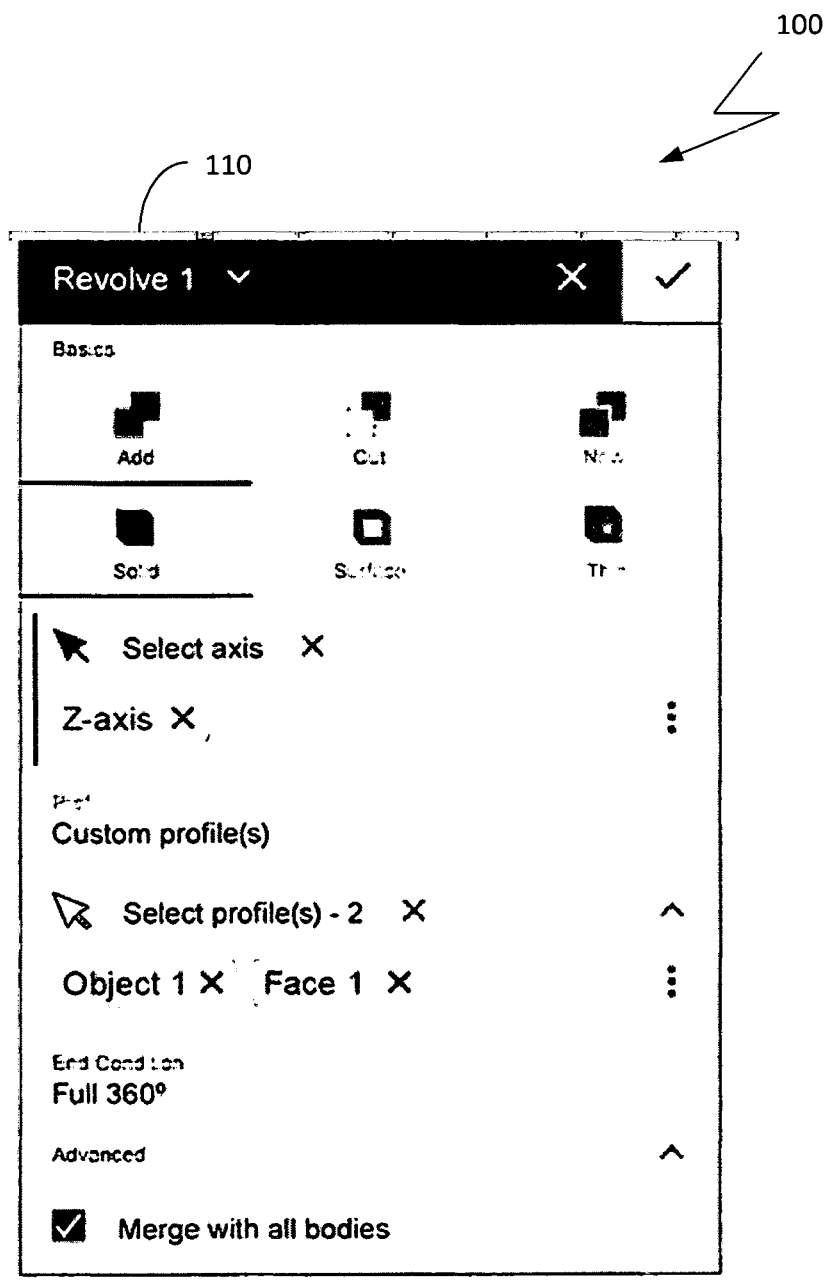
Figure 1C:
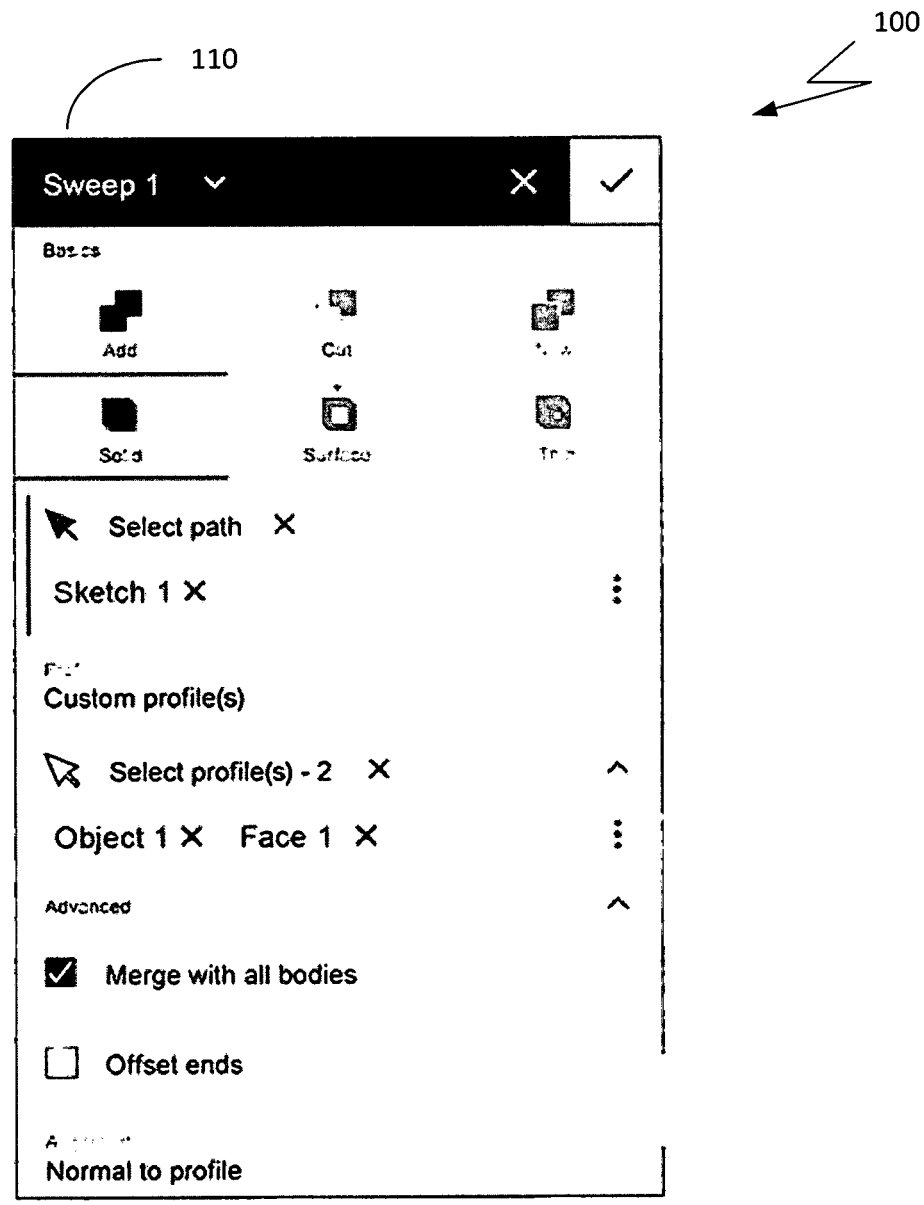

FIGS. 1a, 1b, and 1c illustrate a user interface 100 in an embodiment of the present invention. The header 101 of the user interface 100 differs depending on the method chosen (i.e., extrude, revolve, or sweep). The information and selections beneath the header reflect the method chosen in the header.

In addition to combining the three operations into one command, the super feature command also includes options for creating a custom profile and pre-defined profiles. The pre-defined profile options allow the user to select a common shape for creating geometry, such as rectangles and circles, which the super feature command generates. Providing pre-defined profiles frees a user from having to create a sketch prior to creating geometry. This has the additional benefit of speeding the geometry creation process. The super feature command automatically creates the designated profile sketch and allows for the profile sketch to be edited after creation. The feature method is determined by a path parameter. For an extrude feature, the path is linear and the only input needed is a sketch (i.e., a profile). A revolve feature has a circular path and an axis is needed as input. The number of degrees for the revolution may also be designated, and if not designated, the feature has a 360 degree revolution. When the path parameter is a custom sketch drawn by the user, a sweep feature is created. Those skilled in the art understand the different methods for creating the extrude, revolve, and sweep features geometrically, including a blind extrude and a bi-directional revolve. (For those not skilled in the art, a blind extrude is an extrude up to a specified depth; this is in contrast to a through-all extrude in which the extrude continues through the entire model no matter how large that model is. A bi-directional revolve is a revolve that has two directions, for example. A revolve of a profile 45 degrees around the axis in one direction –30 degrees in another direction.)

Header data for a super feature contains the name of the feature and the method used to create the feature. The method may be changed if the user modifies the super feature to apply a revolve operation instead of an extrude operation, for example.

In general, the present invention assigns the same identifier (ID) to the same output faces and edges no matter how the super feature is defined. For example, if in a given state the extrude, revolve, and sweep operations each produce six faces, then those six faces all have the same ID if the operation is changed from an extrude, revolve, or sweep operation to one of the other two operations. This allows other operations that reference those faces to continue to recognize the faces and update the model without producing an error. Only if geometry is changed to a different type and a reference requires a different geometry type would failure upon update occur. For example, if a planar face becomes a cylindrical face then a parallel mate will likely result in a failure upon update.

When a super feature is edited and the method or path geometry is changed, whether face IDs are retained is dependent upon whether the profile changes and/or the number of faces before and after the modification. If the profile remains the same and the number of output faces remains the same then the face and edge IDs are all retained. If the profile remains the same and the number of face IDs changes, (a) the end face and edge IDs are retained, (b) faces that are created as a result of the modification from the same entities in the profile that created faces prior to the modification retain their ID and new and removed faces created thereafter are subject to a change in ID, and (c) faces created from new entities have a new ID. When the edited super feature's profile changes, faces that are created from the same sketch entity before and after the modification retain their face and edge IDs; new IDs are created for new entities.

Downstream references to faces and edges should not fail so long as the new geometry type supports the reference. Sketches on a planar face created from the feature should not fail (e.g., loose the plane) as long as the new face is remains planar. Fillets on the edges of the output geometry should not fail. Moreover, sketch constraints to the faces and edges of the output, and reference geometry defined using the output geometry should not fail.

Figure 2A:
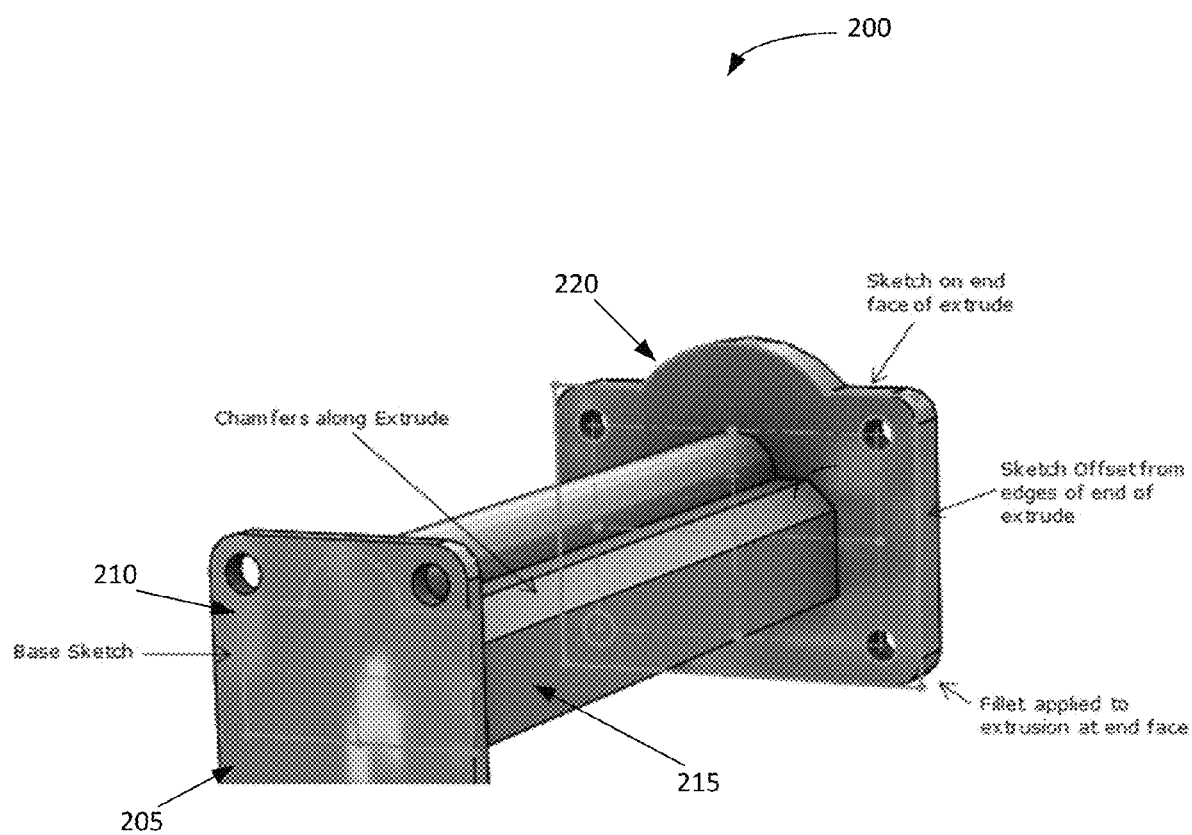
FIG. 2a-2c are illustrations of a 3D model in an embodiment of the present invention.

Referring now to FIG. 2a, an example of a cantilever support 200 having flanges on each side is shown. Cantilever support 200 was created by extruding three different sketches. After extruding the first sketch, the small end plate 205 was created. After extruding the second sketch (i.e., base sketch 210), the main beam 215 was created. And after extruding the third sketch, the large end plate 220 was created.

Figure 2B:
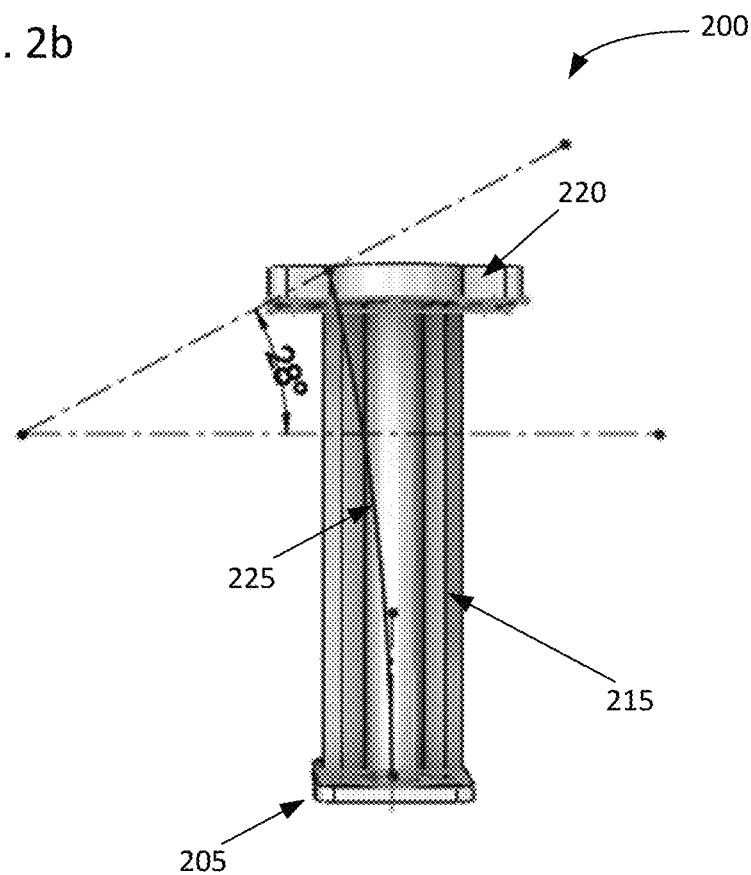
Figure 2C:
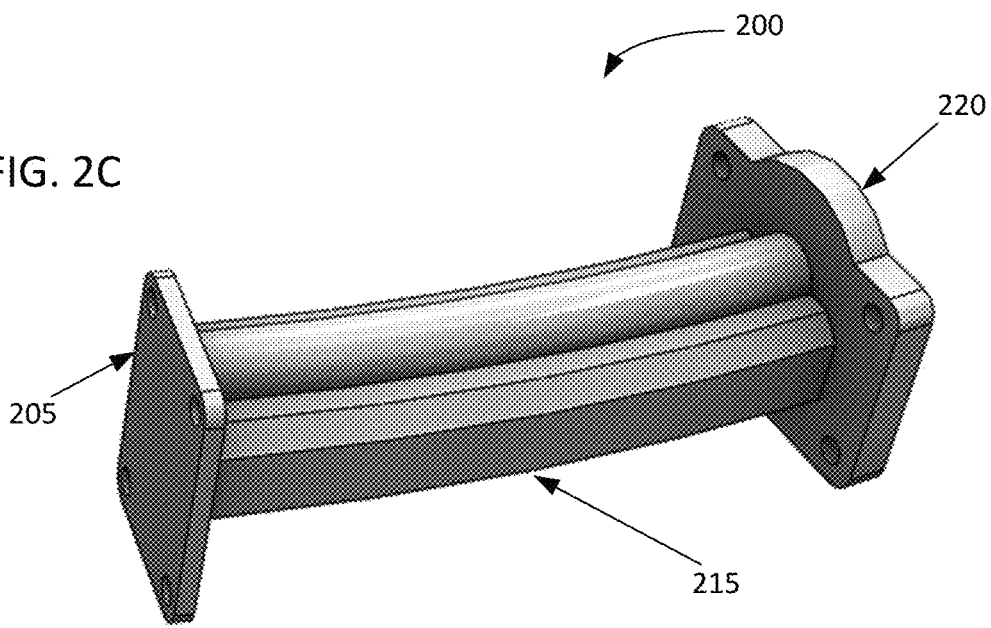

FIG. 2b illustrates a change in the design of the cantilever support 200. The large end plate is to change to be at a 28 degree angle with respect to the small end plate 205. Without the implementation of the present invention, after deleting the main beam 215, the large end plate 220 would need to be re-built entirely. However, the present invention allows the user to simply sketch a path 225 that represents the new beam shape. The user can change the extrude operation applied to base sketch 210 to a sweep operation, providing path 225. Changing the operation is easily done by changing the header 110 in the user interface shown in FIG. 1a from extrude to a sweep as shown in the user interface in FIG. 1c. The number of output faces has not changed, and none of the references are dependent on the beam being linear.

Figure 3A:
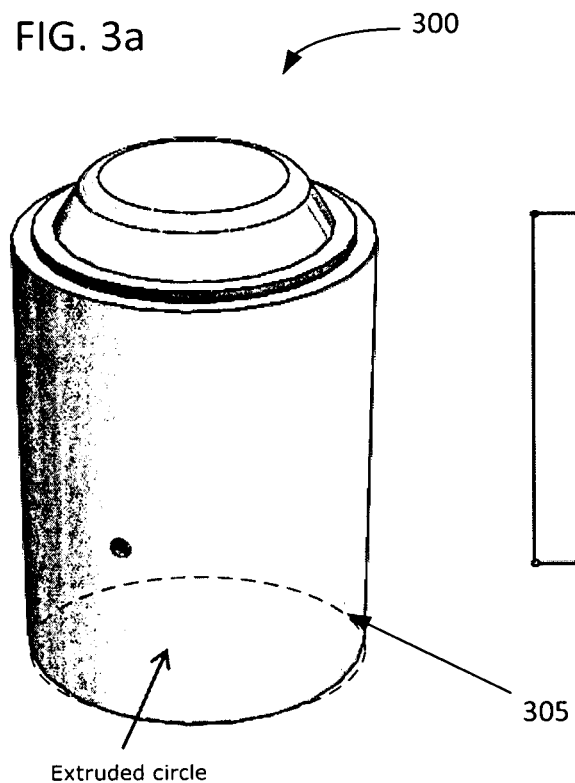
FIG. 3a-3e are illustrations of a 3D model in an embodiment of the present invention.
Figure 3B:
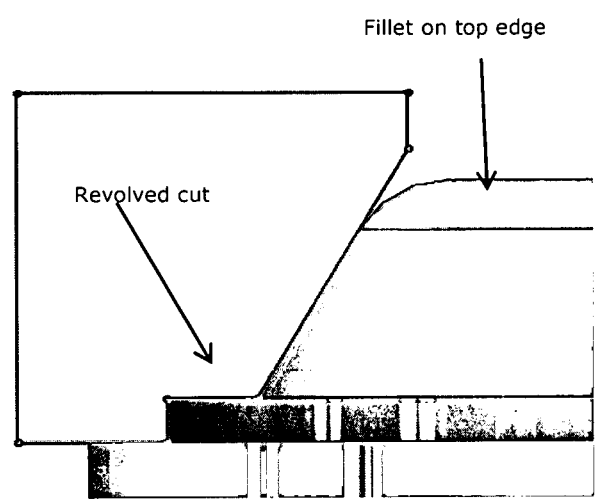
Figure 3C:
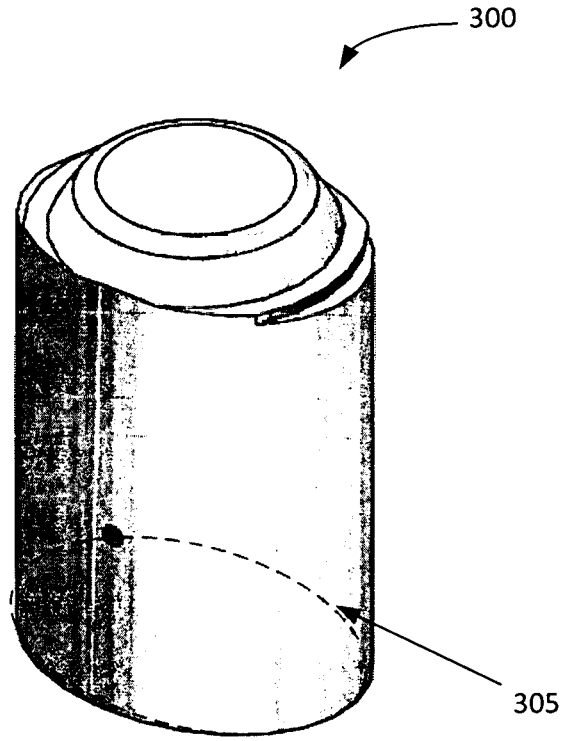
Figure 3D:
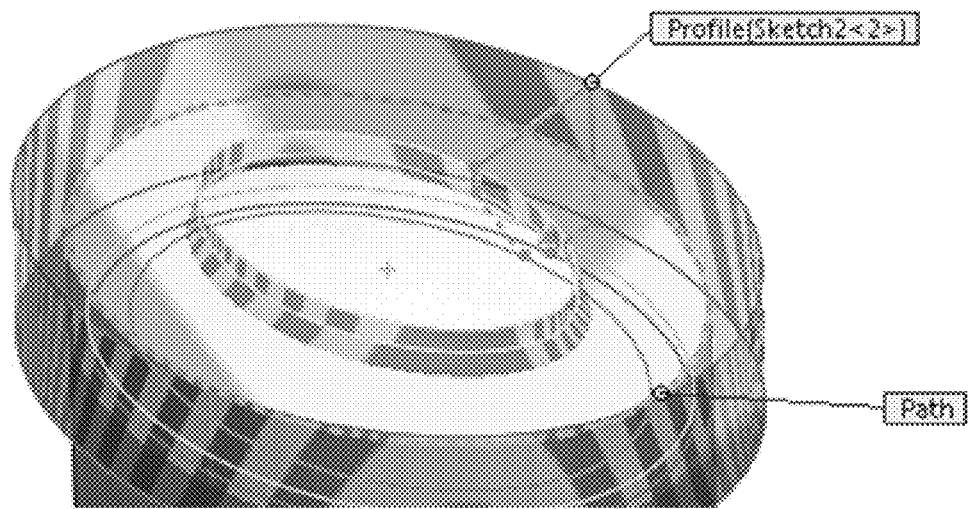
Figure 3E:
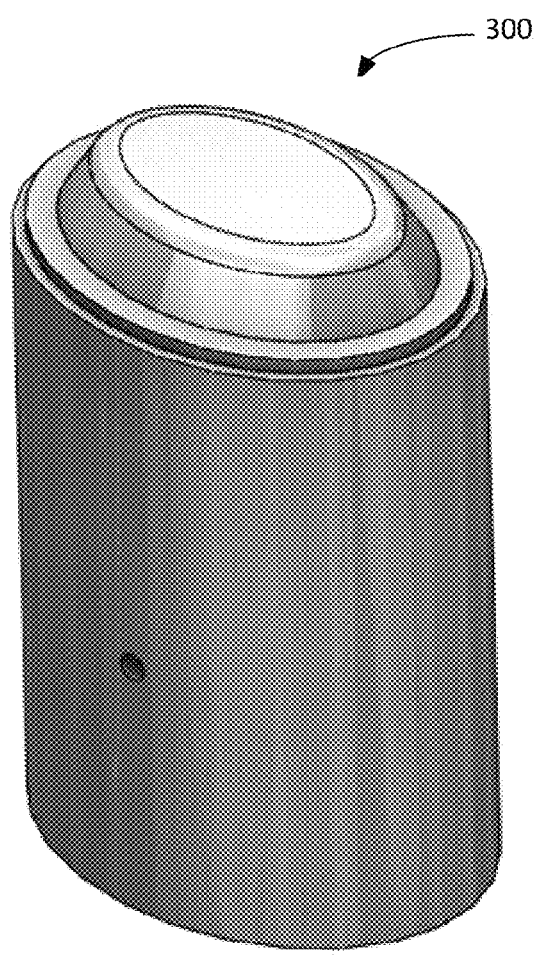

Referring now to FIGS. 3a-3d, a cylindrical fitting 300 is shown. Due to the cylindrical nature of the cylindrical fitting 300, subsequent features are created as revolves. Without the implementation of the present invention, a design change to modify the shape of the base sketch 305 to an ellipse would result in an incorrect model, as shown in FIG. 3c. However, the present invention allows for modifying the revolve to a sweep instead of deleting the revolve and rebuilding the geometry as a sweep. A new cylindrical edge can be input as the path. In this case, the fillet will rebuild successfully and does not need to be edited as the edge ID is the same (number of face IDs are the same in this case).

Figure 4:
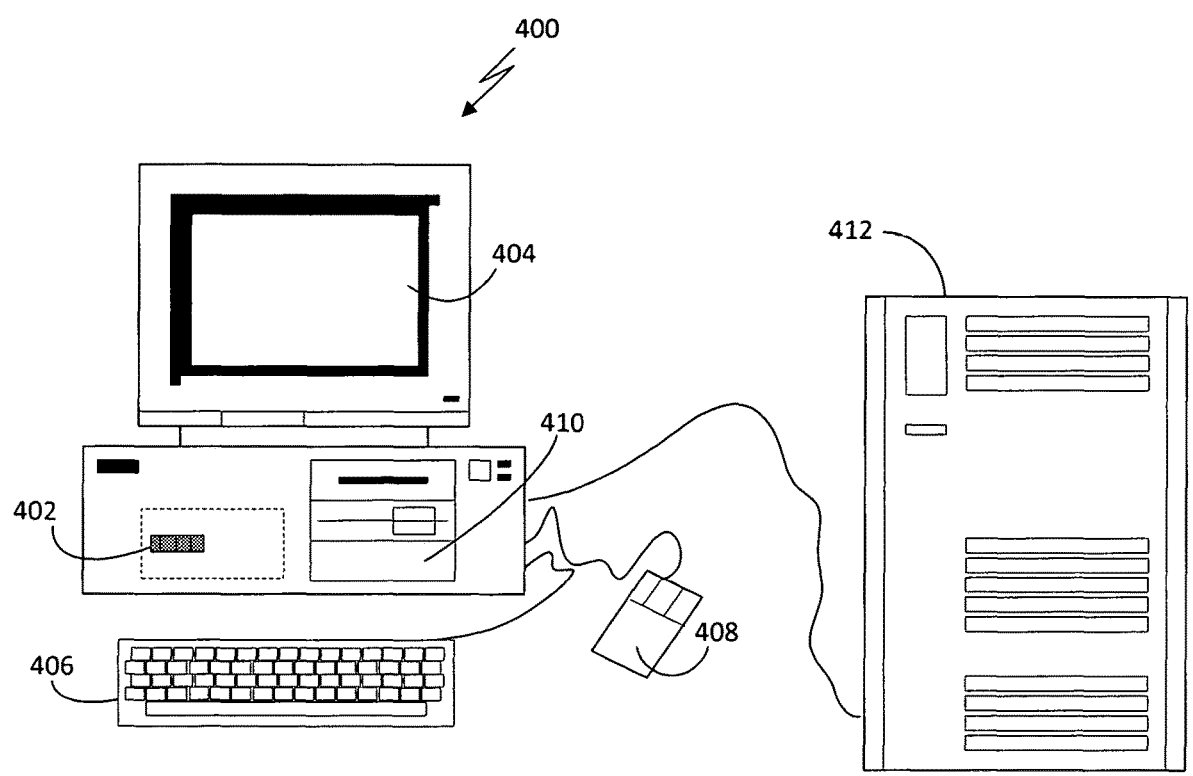
FIG. 4 is a schematic diagram of a computer system in which embodiments of the present invention may be implemented.

FIG. 4 illustrates a computerized modeling system 400 that includes a CPU 402, a computer monitor 404, a keyboard input device 406, a mouse input device 408, and a storage device 410. The CPU 402, computer monitor 404, keyboard 406, mouse 408, and storage device 410 can include commonly available computer hardware devices. For example, the CPU 402 can include an Intel-based processor. The mouse 408 may have conventional left and right buttons that the design engineer may press to issue a command to a software program being executed by the CPU 402. As an alternative or in addition to the mouse 408, the computerized modeling system 400 can include a pointing device such as a mouse, stylus, touch-sensitive pad, or pointing device and buttons built into the keyboard 406. Those of ordinary skill in the art appreciate that the same results described herein with reference to a mouse device can be achieved using another available pointing device. Other appropriate computer hardware platforms are suitable as will become apparent from the discussion herein. Such computer hardware platforms are preferably capable of operating the Microsoft Windows® 7, UNIX, Linux, or MAC OS operating systems.

Additional computer processing units and hardware devices (e.g., rapid prototyping, video, and printer devices) may be included in the computerized modeling system 400. Furthermore, the computerized modeling system 400 may include network hardware and software thereby enabling communication to a hardware platform 412, and facilitating communication between numerous computer systems that include a CPU and a storage system, among other computer components.

Computer-aided modeling software (e.g., process 500) may be stored on the storage device 410 and loaded into and executed by the CPU 402. The modeling software allows a design engineer to create and modify a 3D model and implements aspects of the invention described herein. The CPU 402 uses the computer monitor 404 to display a 3D model and other aspects thereof as described. Using the keyboard 406 and the mouse 408, the design engineer can enter and modify data associated with the 3D model. The CPU 402 accepts and processes input from the keyboard 406 and mouse 408. The CPU 402 processes the input along with the data associated with the 3D model and makes corresponding and appropriate changes to that which is displayed on the computer monitor 404 as commanded by the modeling software. In one embodiment, the modeling software is based on a solid modeling system that may be used to construct a 3D model consisting of one or more solid and surface bodies.

Embodiments of the invention may be implemented in digital electronic circuitry, or in computer hardware, firmware, software, or in combinations thereof. Apparatuses may be implemented in a computer program product tangibly embodied in a machine-readable storage device for execution by a programmable processor; and method steps may be performed by a programmable processor executing a program of instructions to perform functions by operating on input data and generating output. Embodiments of the invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory and in some embodiments instructions and data may be downloaded through a global network. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

Embodiments of the present invention or aspects thereof described herein may be implemented in the form of hardware, firmware, or software. If implemented in software the software may be stored on any non-transient computer readable medium that is configured to enable a processor to load the software or subsets of instructions thereof. The processor then executes the instructions and is configured to operate or cause an apparatus to operate in a manner as described herein.

Although the present invention is described in connection with an exemplary computer system environment, embodiments of the invention are operational with numerous other general purpose or special purpose computer system environments or configurations. The computer system environment is not intended to suggest any limitation as to the scope of use or functionality of any aspect of the invention. Moreover, the computer system environment should not be interpreted as having any dependency or requirement relating to any one or combination of components illustrated in the exemplary operating environment. Examples of computer systems, environments, and/or configurations that may be suitable for use with aspects of the invention include, but are not limited to, personal computers (PCs), server computers, hand-held and laptop devices, multiprocessor systems, microprocessor-based systems, set top boxes, programmable consumer electronics, mobile telephones and mobile operating systems, network PCs, minicomputers, mainframe computers, distributed computing environments that include any of the above systems or devices, and the like. The computer system may have standalone components or workstations, or the computer system may be formed of networked computers by any of known communications networks, processing networks, cloud-based networks, related protocols and the like.

As can be appreciated, the network can be a public network, such as the Internet, or a private network such as an LAN or WAN network, or any combination thereof and can also include PSTN or ISDN sub-networks. The network can also be wired, such as an Ethernet network, or can be wireless such as a cellular network including EDGE, 3G and 4G wireless cellular systems. The wireless network can also be WiFi, Bluetooth, or any other wireless form of communication that is known. Thus, the network is merely exemplary and in no way limits the scope of the present advancements.

Advantages of the present invention include the ability to allow a user to create an extrude, a revolve, or a sweep feature and easily change between these feature types while maintaining the downstream references. Additionally, a user interface that enables a user to clearly see the differences between the methods for creating an extrude, a revolve, and a sweep feature, and therefore, better understand how the operations that create these features work. From a parametric modeling standpoint, an advantage is that design changes are more flexible and less problematic.

Further advantages include an efficient means of creating geometry by providing pre-defined profiles to create a sketch, which may be edited by the user. The super feature command then operates on the sketch entities to create an extrude, a sweep, and/or a revolve feature.

A number of embodiments of the present invention have been described. Nevertheless, it will be understood by those skilled in the art that various modifications may be made within the boundaries of the invention. For example, embodiments of the present invention may change the order in which operations are performed. Furthermore, depending on the needs of an implementation, particular operations described herein may be implemented as a combined operation, eliminated, added to, or otherwise rearranged. By way of non-limiting example, the present invention may be applied to super features that include other types of features and operations, such as creating an extruded solid, extruded surface, and an extruded thin feature; blending an edge to create a fillet or a chamfer feature; and extruding a variable profile to create a loft.

What is claimed is:

1. A computer-implemented method for modifying a feature type of a computer-aided design model, the method comprising:
    constructing a three-dimensional (3D) model, wherein:
        the 3D model is comprised of multiple features, where each feature of the multiple features results from an operation on a geometric entity; and
        a feature type of each feature of the multiple features is one of a set of feature types comprised of an extrude feature, a revolve feature, and a sweep feature;
    providing a command that upon execution creates one feature of the set of feature types, the created feature and other features being the multiple features composing the constructed 3D model;
    creating references to a set of faces of the created feature composing the constructed 3D model;
    modifying the created feature composing the constructed 3D model, wherein modifying the created feature changes the feature type of the created feature from one member in the set of feature types to a different member in the set of feature types based upon user input of a property of the different member in the set of feature types;
    maintaining the references to the set of faces of the created feature after said modifying the created feature by changing the feature type from one member in the set of feature types to the different member in the set of feature types; and
    updating the other features composing the constructed 3D model based on the maintained references, wherein the other features are dependent on the created feature and reference at least one face of the set of faces of the created feature.

2. The computer-implemented method of claim 1, wherein:
    each face in the set of faces has a face identifier; and
    maintaining the references is enabled by retaining the face identifier of at least one face in the set of faces of the created feature after modification of the created feature as the face identifier was before modifying the created feature despite a change in geometry of the at least one face.

3. The computer-implemented method of claim 1, further comprising:
    providing a user interface enabling a user to specify one of the extrude feature, the revolve feature, and the sweep feature; and
    modifying the feature type by specifying in the user interface another one of the extrude feature, the revolve feature, and the sweep feature.

4. A computer-aided design system comprising:
    a processor operatively coupled to a data storage system, the data storage system storing a three-dimensional model; and
    a data storage memory operatively coupled to the processor and comprising instructions to configure the processor to:
        construct a three-dimensional (3D) model by creating a feature, wherein multiple features, including the created feature and other features compose the constructed 3D model, a feature type of each feature of the multiple features is one of a set of feature types comprised of an extrude feature, a revolve feature, and a sweep feature, and each feature of the multiple features results from an operation on a geometric entity;
        create references to a set of faces of the created feature composing the constructed 3D model;
        modify the created feature composing the constructed 3D model, wherein modifying the created feature changes the feature type of the created feature from one member in the set of feature types to a different member in the set of feature types based upon user input of a property of the different member in the set of feature types;
        maintain the references to the set of faces of the created feature after said modifying the created feature by changing the feature type from one member in the set of feature types to the different member in the set of feature types; and
        update the other features composing the constructed 3D model based on the maintained references, wherein the other features are dependent on the created feature and reference at least one face of the set of faces of the created feature.

5. A non-transitory computer-readable data storage medium comprising instructions causing a computer to:
    construct a three-dimensional (3D) model comprised of multiple features, wherein each feature of the multiple features results from an operation on a geometric entity and a feature type of each feature of the multiple features is one of a set of features comprised of an extrude feature, a revolve feature, and a sweep feature;

provide a command that upon execution creates one feature of the set of feature types, the created feature and other features being the multiple features composing the constructed 3D model;

create references to a set of faces of the created feature composing the constructed 3D model;

modify the created feature composing the constructed 3D model, wherein modifying the created feature changes the feature type of the created feature from one member in the set of feature types to a different member in the set of feature types based upon user input of a property of the different member in the set of feature types;

maintain the references to the set of faces of the created feature after said modifying the created feature by changing the feature type from one member in the set of feature types to the different member in the set of feature types; and update the other features composing the constructed 3D model based on the maintained references, wherein the other features are dependent on the created feature and reference at least one face of the set of faces of the created feature.

6. The computer-implemented method of claim 1, further comprising:
assigning an identifier to a first face that is output upon creating the feature;
assigning the identifier to a second face that is output upon modifying the created feature; and
using the identifier to reference the second face without error.

7. The computer-implemented method of claim 1, wherein modifying the created feature changes the created feature to a sweep feature given the user input of a path for a sweep operation.

8. The computer-implemented method of claim 1, wherein the command combines an extrude operation, a revolve operation, and a sweep operation each with a different set of parameters to produce the extrude feature, the revolve feature, and the sweep feature, respectively.

9. The computer-implemented method of claim 3, wherein the user input is one of a linear path, a circular path, and a custom sketch.

10. The computer-aided design system of claim 4, wherein, for maintaining references, the data storage memory comprises further instructions to configure the processor to:
assign a face identifier to a face in the set of faces; and
after modifying the created feature, assign the face identifier to a new face that replaces the face in the set of faces.

11. The computer-aided design system of claim 10, wherein:
the face is output upon creating the feature; and
the new face is output upon modifying the created feature.

12. The computer-aided design system of claim 4, further comprising instructions to configure the processor to:
modify the created feature from an extrude feature to a sweep feature, wherein the user input specifies a path for a sweep operation;
apply the path to a sketch used to create the extrude feature; and
use a same set of face identifiers for the set of faces created for the sweep feature as used for the extrude feature.

13. The computer-aided design system of claim 4, further comprising instructions to configure the processor to provide a user interface module enabling change of the created feature from one feature type in the set of feature types to a different feature type in the set of feature types after a modification of the user input specified in the user interface module.

14. The computer-aided design system of claim 13, wherein the user input specifies one of a linear path, a circular path, and a custom sketch.

15. The computer-aided design system of claim 4, wherein before and after execution of an instruction to modify the created feature, the created feature contains a same number of faces and a same set of identifiers is used to identify the set of faces.

16. The computer-readable data storage medium of claim 5, wherein, for maintaining references, the computer-readable data storage medium comprises further instructions to cause the computer to:
assign a face identifier to a face in the set of faces;
after modifying the created feature, revise the set of faces to represent the other member in the set of features; and
assign the face identifier to a respective face in the revised set of faces.

17. The computer-readable data storage medium of claim 16, wherein:
the face is output upon creating the feature; and
the respective face is output upon modifying the created feature.

18. The computer-readable data storage medium of claim 5, further comprising instructions to cause the computer to:
modify the created feature from an extrude feature to a sweep feature, wherein the user input specifies a path for a sweep operation;
apply the path to a sketch used to create the extrude feature; and
use a same set of face identifiers for the set of faces created for the sweep feature as used for the extrude feature.

19. The computer-readable data storage medium of claim 5, further comprising instructions to cause the computer to provide a user interface module enabling change of the created feature from one feature type in the set of feature types to a different feature type in the set of feature types after a modification of the user input specified in the user interface module.

20. The computer-readable data storage medium of claim 19, wherein the user input specifies one of a linear path, a circular path, and a custom sketch.

* * * * *